United States Patent [19]
Yamazaki et al.

[11] Patent Number: 5,091,638
[45] Date of Patent: Feb. 25, 1992

[54] CONTACT IMAGE SENSOR HAVING LIGHT-RECEIVING WINDOWS

[75] Inventors: Shunpei Yamazaki, Tokyo; Takeshi Fukada, Ebina; Mitsunori Sakama, Hiratsuka; Hisato Shinohara, Sagamihara; Nobumitsu Amachi, Atsugi; Naoya Sakamoto, Atsugi; Takashi Inuzima, Atsugi, all of Japan

[73] Assignee: Semiconductor Energy Laboratory Co., Ltd., Kanagawa, Japan

[21] Appl. No.: 554,342

[22] Filed: Jul. 19, 1990

[30] Foreign Application Priority Data

Oct. 21, 1987 [JP] Japan .................. 62-255098
Oct. 21, 1987 [JP] Japan .................. 62-266099
Oct. 21, 1987 [JP] Japan .................. 62-266100

[51] Int. Cl.$^5$ ............................. H01J 40/14
[52] U.S. Cl. ........................ 250/208.1; 357/30
[58] Field of Search .......... 250/208.1, 211 J, 211 R; 357/30 H, 30 Q

[56] References Cited

U.S. PATENT DOCUMENTS

| | | | |
|---|---|---|---|
| 4,149,197 | 4/1979 | Kos et al. | 250/208.1 |
| 4,689,438 | 8/1987 | Fukatsu et al. | 357/30 Q |
| 4,754,152 | 6/1988 | Hayama et al. | 250/208.1 |
| 4,855,802 | 8/1989 | Kato | 250/208.1 |

Primary Examiner—David C. Nelms
Assistant Examiner—Khaled Shami
Attorney, Agent, or Firm—Sixbey, Friedman, Leedom & Ferguson

[57] ABSTRACT

An improved image sensor is described. The sensor includes a photosensitive semiconductor device comprises a glass substrate, a light blocking electrode formed on the glass substrate, a photosensitive semiconductor film formed on the electrode, a transparent electrode. A light window is opened through the semiconductor device. On the light path including the light window, an uneven interface is formed in order that light rays incident on the sensor is modified and reachs the photosensitive semiconductor after reflection on an original.

12 Claims, 7 Drawing Sheets

CONTACT IMAGE SENSOR HAVING LIGHT-RECEIVING WINDOWS

This is a divisional application of Ser. No. 259,522, filed Oct. 18, 1988, now U.S. Pat. No. 4,959,533.

BACKGROUND OF THE INVENTION

The present invention relates to a contact image sensor.

There are two classes of contact type image sensors from the view point of their construction. The image sensors of one class is represented by illustration as shown in FIG. 1. The sensor of this type comprises a photosensor 10, a light source 12 provided extending parallel to the photosensor 10 and a lense 11 located so as to focus light rays emitted from the light source 12 and reflected on an original 1 to the photosensor 10. The size and weight of the image sensors of this type are increased by provision of the lense, as compared with those of the other class.

The operation of the image sensors of the other type may be understood from FIG. 3 which illustrates an embodiment but is explained here for the purpose of demonstration of the other type operation. In this construction, a photosensitive semiconductor device consisting of a pair of electrodes 3 and 5 and a semiconductor film 4 therebetween is formed on a glass substrate 2. A window is opened through the semiconductor device in order to allow light rays to pass therethrough from a light source 12 located behind the glass substrate 2 to the opposite side. A transparent insulating film 6 is coated over the photosensitive device. For operation, the device is placed on and makes contact with the surface of an original 1. Light rays are passed through the window 8, reflected in the original 1, and sensed by the semiconductor. However, a large number of manufacturing steps in photolithography are required for producing such devices and therefore production cost is increased.

SUMMARY OF THE INVENTION

It is an object of the present invention to provide an image sensor which is immune to the influence of incident light rays which are not reflected on an original.

DETAILED DESCRIPTION OF THE PREFERRED EMBODIMENTS

Figure 1:
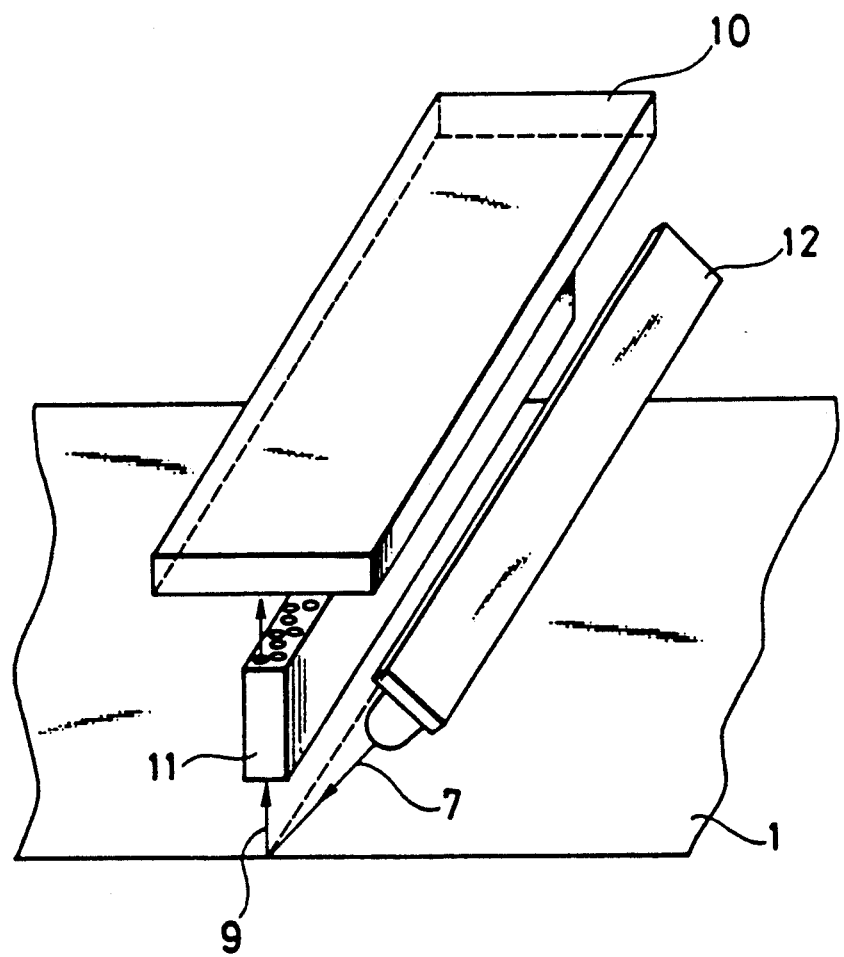
FIG. 1 is a perspective view showing a prior art image sensor.

Referring now to FIGS. 2(A) to 2(D), a method of manufacturing image sensors in accordance with the present invention.

A transparent $SnO_2$ film 3 of 0.5–0.6 micron thickness is first formed on a transparent glass substrate 2 by a conventional CVD method. The $SnO_2$ film 3 is severed into a plurality of transparent electrodes of 125 microns width and 100 microns length by laser scribing utilizing an KrF eximer laser in order to form grooves 13. The distance between adjacent electrodes is 50 microns. A photosensitive amorphous silicon semiconductor film comprising an NIN junction is formed on the substrate 2 over the electrodes by a conventional plasma CVD. The deposition condition of the formation of the semiconductor film is as follows:

| | [N-type] | | |
|---|---|---|---|
| precursor gases; | $PH_3/SiH_4$ | 0.5% | 5 SCCM |
| | $SiH_4$ | 100% | 100 SCCM |
| pressure; | 0.1 Torr | | |
| electric power; | 20W (13.56 MHz) | | |
| substrate temperature; | 250° C. | | |
| | [I-type] | | |
| precursor gases; | $SiH_4$ | 100% | 100 SCCM |
| | (other conditions are identical to those of N-type) | | |

A molybdenum film 5 (light-blocking film) of 0.2 micron is formed on the semiconductor film 4 followed by laser scribing to cut grooves 14 throughout the thicknesses of the molibdenum film 5 and the semiconductor film 4, in alignment with the grooves 13 but with a width of 10 microns. By this scribing, separated sensing cell elements are formed. This laser scribing is performed also with a KrF excimer laser. Then, a portion of each separated film 4 and an overlying electrode 5 is removed by laser scribing in the same manner in order to open a light window 8. The laser scribing is effected also on the surfaces of the underlying transparent electrodes 3 in order to form concave surfaces.

Figure 2A:
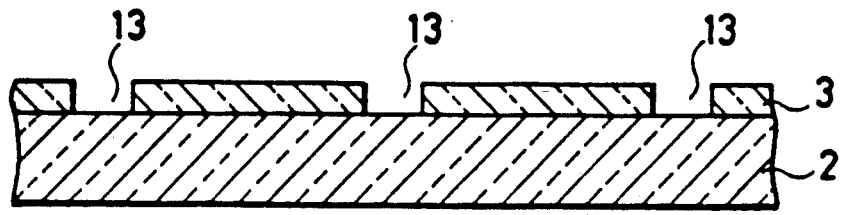
FIGS. 2(A) to (D) are cross sectional views showing the manufacturing procedure in accordance with the present invention.
Figure 2B:
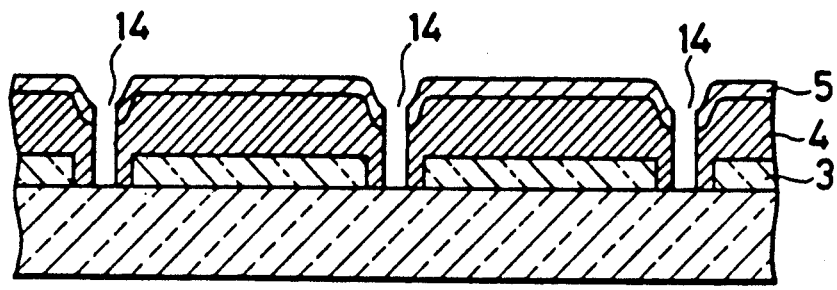
Figure 2C:
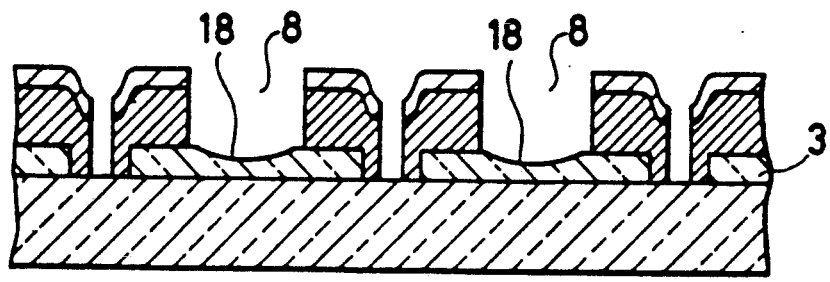
Figure 2D:
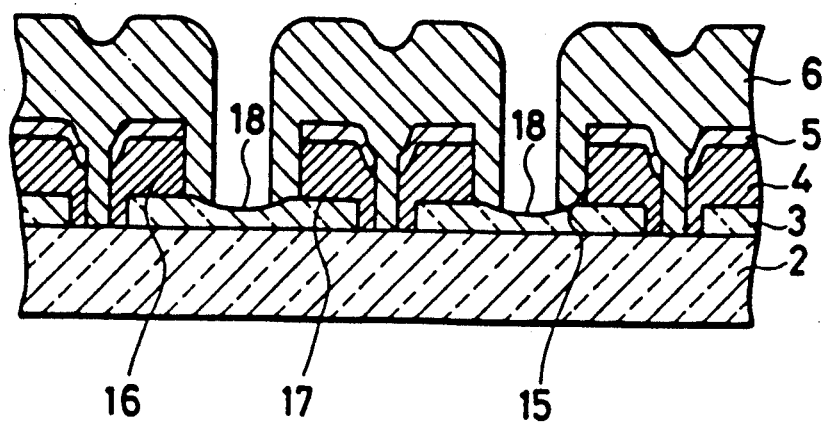

Finally, an opaque epoxy resin layer is coated over the structure by screen press printing technique in order that the light windows 8 are opened and that the side surfaces of the semiconductor films are protected by the resin layer as shown in FIG. 2(D).

Figure 3:
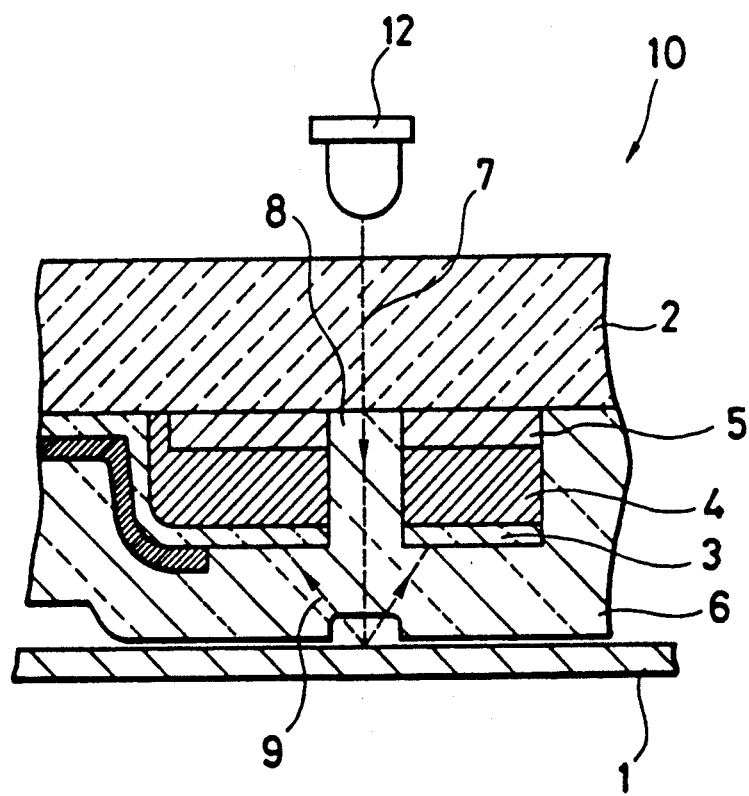
FIG. 3 is an explanational view showing the operation of an image sensor in accordance with the present invention.

The operation of the device is as explained above with reference to FIG. 3. Namely, an original is relatively located in order to make contact with the lower surface of the substrate 2, and a light source is located in the resin layer side. Light rays incident on the device pass through the light windows 8, reflected on the surface of an original and detected by the photosensitive semiconductor film 4 adjacent to the windows 8.

Figure 4A:
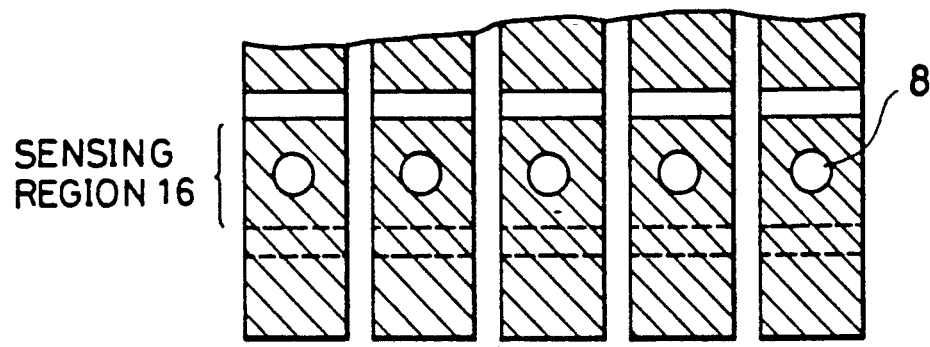
FIGS. 4(A) to 4(C) are plan views showing examples of patterns of light windows in accordance with the present invention.
Figure 4B:
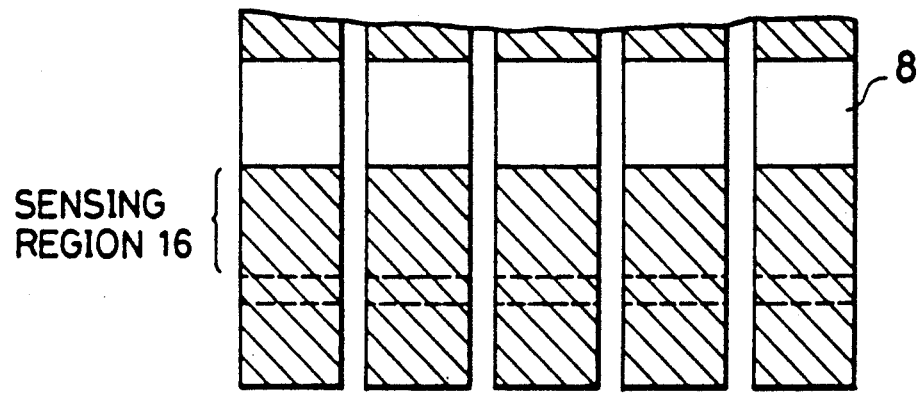
Figure 4C:
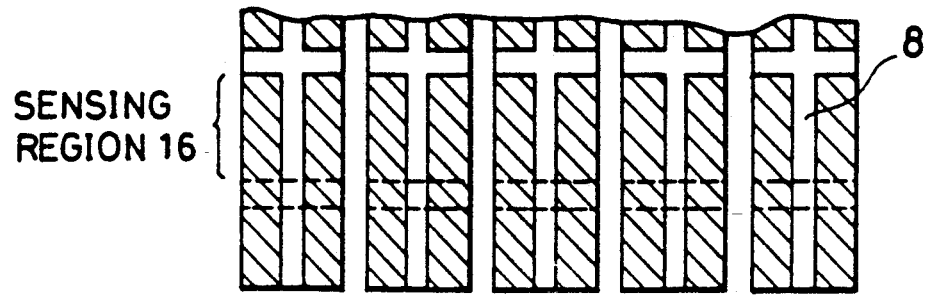

FIGS. 4(A) to 4(C) are plan view showing examplary patterns of windows 8. An circular window is opened for each photosensitive cell as shown in FIG. 4(A). Pulsed spot laser beams are suitable for forming the circular windows of this kind. An excimer laser can emit laser beams which is focussed with a uniform energy density having a cross section 10 microns thick and 100 mm wide. By use of this laser beam, a linear groove extending over a plurality of photosensitive cell elements can be formed in order to provide a window for each cell as illustrated in FIG. 4(B). A linear groove may be formed perpendicular to the case of FIG. 4(B) to form light windows 8 as shown in FIG. 4(C).

Figure 5A:
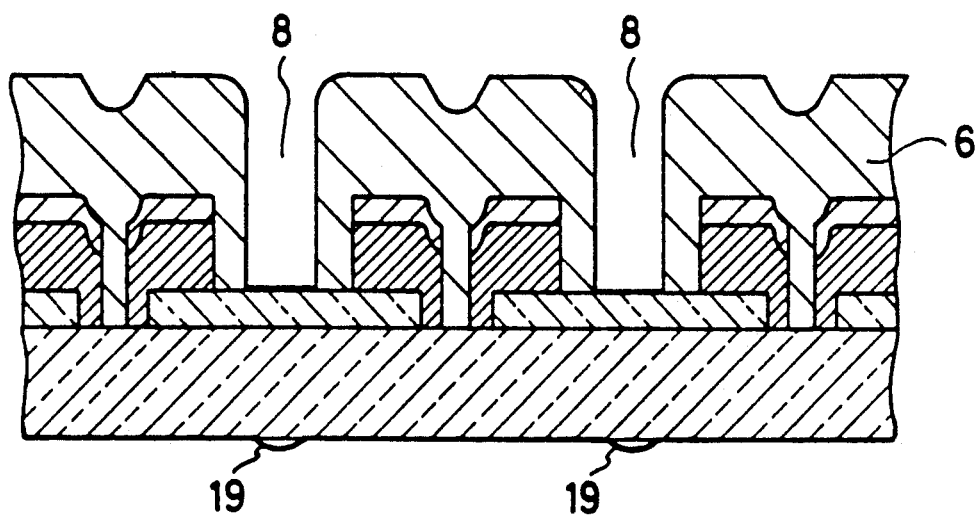
FIG. 5 is a cross sectional view showing a modification of the sensor illustrated in FIGS. 2(A) to 2(D).

FIG. 5 shows an modification of the embodiment of FIGS. 2(A) to 2(D). In this modification, the etching is stopped just at the upper surface of the transparent electrodes 3, and convex surfaces 19 are formed on the lower surface of the substrate 2 by depositing $SiO_2$ or other transparent materials at the location just in alignment with the light windows 8.

Figure 6A:
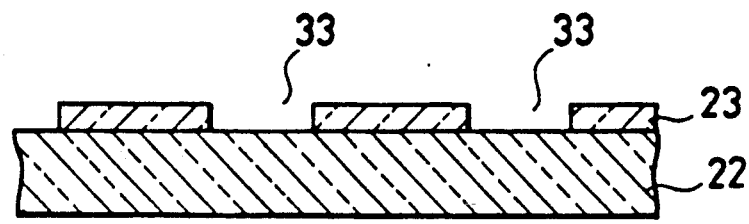
FIGS. 6(A) to 6(C) are cross sectional views showing another embodiment of the present invention.
Figure 6B:
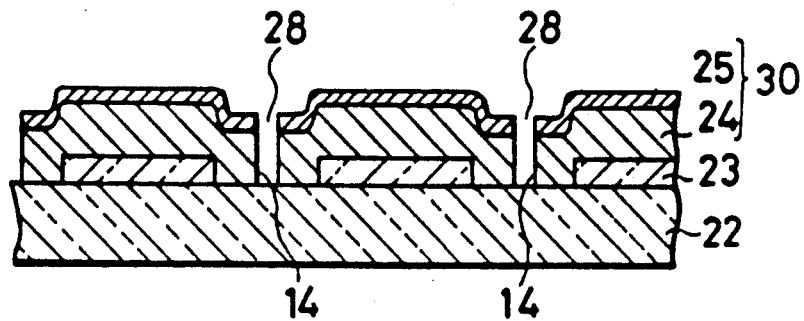
Figure 6C:
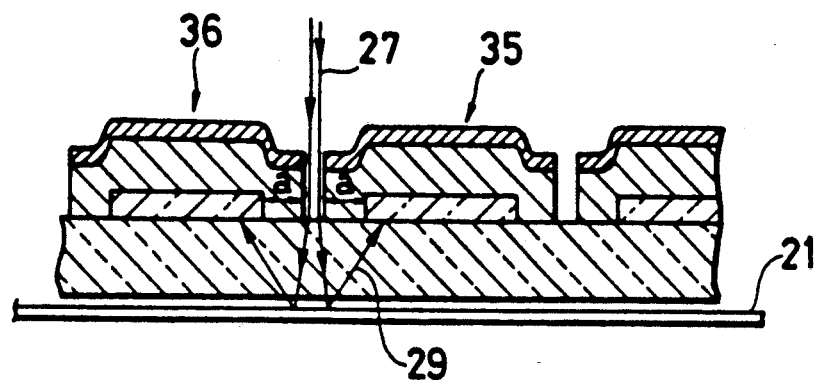

Referring to FIGS. 6(A) to 6(C), another embodiment of the present invention is illustrated. A $SnO_2$ film is deposited on a transparent substrate to a thickness of 0.5-0.6 micron by a known CVD method. The $SnO_2$ film 23 is severed by a KrF excimer laser into a plurality of transparent electrode segments 75 microns wide and 100 microns long as shown in FIG. 6(A). The distance between adjacent electrodes is 50 microns. An NIN photosensitive amorphous silicon semiconductor film 24 of about 0.7 micron thickness is deposited on the substrate 22 over the transparent electrodes 23. The deposition conditions are same as the previous embodiment. Furthermore, a 0.2 micron thick molybdenum film 25 is deposited by a known sputtering technique.

At the center positions between adjacent electrodes 23, the structure is irradiated with laser beams in the same manner as the previous embodiment to open light windows 28 as illustrated in FIG. 6(B). The distance "a" between the side wall of the window and the neighbouring electrode 23 is chosen 20 microns in order to reduce influence of carriers generated by light rays incident on the semiconductor film 24 just adjacent to the windows without reflection on an original. The distance "a" is preferably wider than the thickness of the photosensitive semiconductor film. More specifically, the distance should be chosen wider than the carrier diffusion length, approx. 2 micron in case of amorphous silicond semiconductor. The influence of non-reflected light rays was evaluated by measuring power difference between the case of perfect dark condition and the case that light rays are incident on the sensor having varied distances a without disposing of an original. As a result, the differences are 1% for 20 microns and 5 microns, 3% for 2 microns and 15% for 1 micron. From this experiment, it was proved that a distance not shorter than 2 microns is sufficient. When the thickness of the semiconductor film are varied from 0.3 micron to 1.5 microns, keeping the distance "a" at a constant of 2 microns, the output differences were obtained 1-5%. The operation of the device is substantially identical to that of the previous embodiment.

Figure 7B:
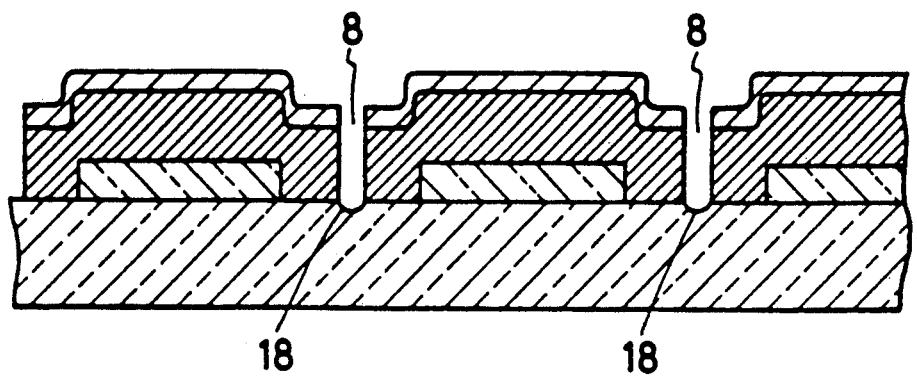
FIG. 7 is cross sectional view showing a modification of the sensor illustrated in FIGS. 6(A) to 6(C).

FIG. 7 is a cross sectional view showing a modification of the embodiment of FIGS. 6(A) to 6(C). In this modification, a portion of the substrate is removed when the light windows are opened by laser scribing in order to form concave surface 18. The provision of concave/covex surfaces, more generally uneven interfaces, on the light paths helps incident light rays to reach the photosensitive semiconductor film which would be displaced from the light paths if the light rays pass only in a straight line.

Figure 8A:
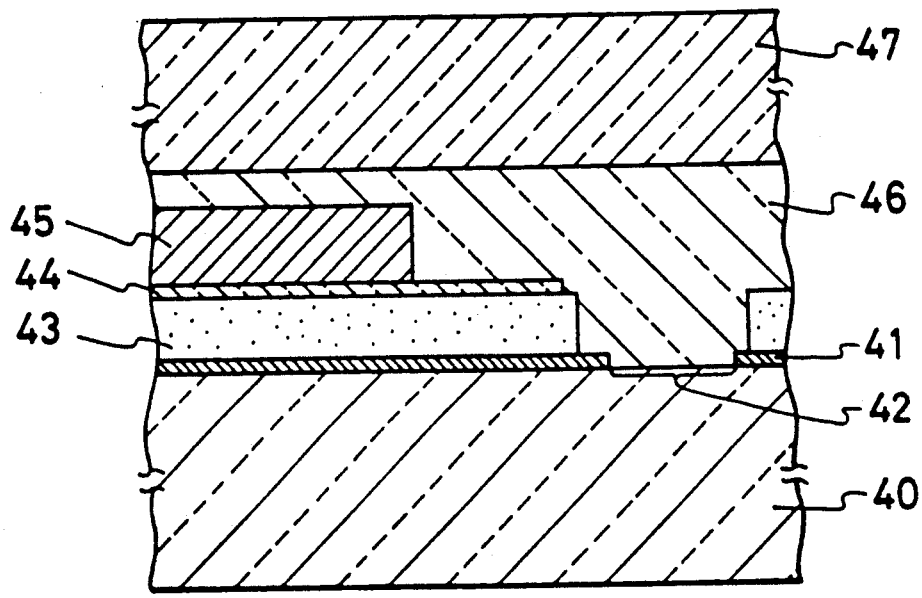
FIGS. 8(A) and 8(B) are cross sectional and plan views showing a further embodiment of the present invention.
Figure 8B:
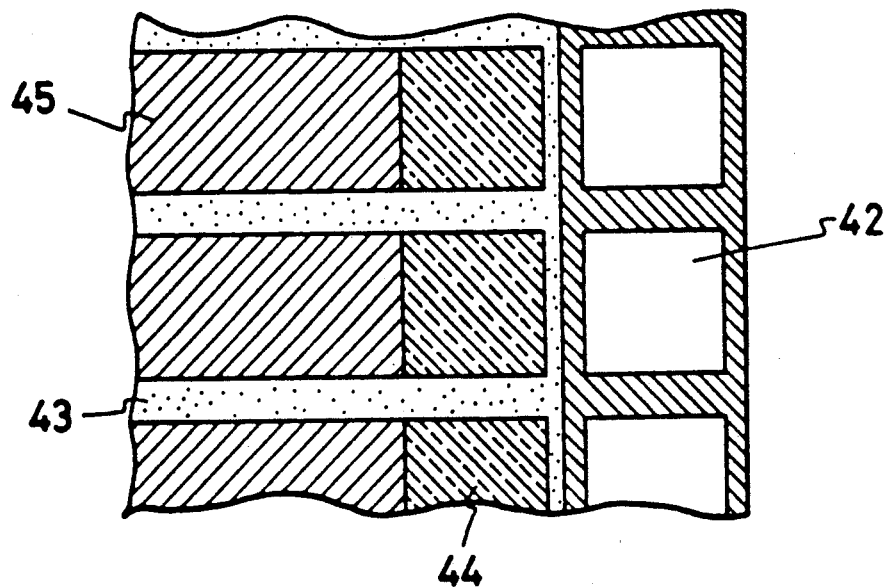

Referring to FIGS. 8(A) and 8(B), a further embodiment is illustrated. The image sensor comprises a 1.1 mm thick glass substrate 40, a cromium common electrode 41 in which light windows 42 are opened, an amorphous silicon semiconductor film 43 in which light windows are opened the area of which is larger than that of the window 42, ITO electrodes 44 extending near to the windows, Al electrodes 45 extending in short of the window along the ITO electrodes 44 in order that the end portions of the ITO electrodes 44 are free from the Al electrodes 45, a transparent adhesive layer 46 and a 50 microns glass substrate 48. In this embodiment, the films 41, 43, 44 and 45 are patterned by a conventional photolithography using photoresists. The ITO film is preferably baked after patterning. An original is placed in contact with the thin glass substrate 47. Light rays pass through the window 42, reflected on the original and received by the amorphous semiconductor 43 between the window 42 an the end of the Al electrode 45.

While several embodiments have been specifically described, it is to be appreciated that the present invention is not limited to the particular examples described and that modifications and variations can be made without departure from the scope of the invention as defined by the append claims.

We claim:

1. An image sensor comprising:
   a glass substrate;
   a light blocking electrode formed on said substrate;
   a photosensitive semiconductor layer formed on said light blocking electrode;
   a transparent electrode formed on said semiconductor layer;
   an opening formed throughout said light blocking electrode, semiconductor layer and transparent electrode to define a light window; and
   a transparent resin layer covering said transparent electrode and opening,
   wherein said light blocking electrode at a periphery of said opening extends over said semiconductor layer.

2. The image sensor of claim 1 wherein said light blocking electrode is a chromium layer.

3. The image sensor of claim 1 wherein said semiconductor layer comprises amorphous silicon.

4. The image sensor of claim 1 wherein said resin layer has an uneven surface at said light window in order to scatter light which passes through said light window.

5. An image sensor comprising:
   a glass substrate;
   a light-blocking electrode formed on said substrate;
   a photosensitive semiconductor layer formed on said light blocking electrode;
   a transparent electrode formed on said semiconductor layer; and
   an opening formed throughout said light blocking electrode, semiconductor layer and transparent electrode to define a light window,
   wherein peripheral portions of said transparent electrode are recessed from peripheral portions of said semiconductor layer at said light window such that the transparent electrode does not extend to a periphery of the semiconductor layer at the light window.

6. The sensor of claim 5 wherein a periphery of said transparent electrode is spaced from said periphery of the semiconductor layer by at least a thickness of said semiconductor layer.

7. The sensor of claim 5 wherein a periphery of said transparent electrode is spaced from said periphery of the semiconductor layer by a diffusion length of a carrier in said semiconductor layer.

8. The sensor of claim 5 wherein said light blocking electrode is a chromium layer.

9. The sensor of claim 5 wherein said semiconductor layer comprises amorphous silicon.

10. An image sensor comprising:
   a glass substrate;
   a light blocking electrode formed on said substrate;
   a photosensitive semiconductor layer formed on said light blocking electrode;
   a transparent electrode formed on said semiconductor layer; and
   an opening formed throughout said light blocking electrode, semiconductor layer and transparent electrode to define a light window,
   wherein said blocking electrode extends beyond a periphery of said semiconductor layer at said opening and wherein peripheral portions of said transparent electrode at said opening are recessed from peripheral portions of the semiconductor layer at the opening such that the transparent electrode does not extend to a periphery of the semiconductor layer at the light window.

11. The sensor of claim 10 wherein a periphery of said transparent electrode is spaced from said periphery of the semiconductor layer by at least a thickness of said semiconductor layer.

12. The sensor of claim 10 wherein a periphery of said transparent electrode is distant from said periphery of the semiconductor layer by a diffusion length of a carrier in said semiconductor layer.

* * * * *